United States Patent
Furukawa et al.

(10) Patent No.: US 7,697,583 B2
(45) Date of Patent: Apr. 13, 2010

(54) SEMICONDUCTOR LASER DRIVING DEVICE AND SEMICONDUCTOR LASER DRIVING METHOD

(75) Inventors: Junichi Furukawa, Saitama (JP); Kiyoshi Tateishi, Saitama (JP)

(73) Assignee: Pioneer Corporation, Tokyo (JP)

( * ) Notice: Subject to any disclaimer, the term of this patent is extended or adjusted under 35 U.S.C. 154(b) by 231 days.

(21) Appl. No.: 11/910,282

(22) PCT Filed: Mar. 30, 2006

(86) PCT No.: PCT/JP2006/306636
§ 371 (c)(1),
(2), (4) Date: Nov. 20, 2007

(87) PCT Pub. No.: WO2006/106810
PCT Pub. Date: Oct. 12, 2006

(65) Prior Publication Data
US 2009/0232174 A1    Sep. 17, 2009

(30) Foreign Application Priority Data
Mar. 30, 2005    (JP)    ............... 2005-098526

(51) Int. Cl.
*H01S 3/00*    (2006.01)
*H01S 3/04*    (2006.01)
(52) U.S. Cl. ................................ 372/38.02; 372/43.01
(58) Field of Classification Search .............. 372/38.02, 372/43.01
See application file for complete search history.

(56) References Cited

FOREIGN PATENT DOCUMENTS

| JP | 2002-042362 | 2/2002 |
| JP | 2002-076504 | 3/2002 |
| JP | 2003-209319 | 7/2003 |
| JP | 2003-347664 | 12/2003 |
| JP | 2005-136155 | 5/2005 |
| JP | 2006-048885 | * 2/2006 |

\* cited by examiner

*Primary Examiner*—Armando Rodriguez
(74) *Attorney, Agent, or Firm*—Young & Thompson

(57) ABSTRACT

A semiconductor laser driving device is mounted on an information recording and reproduction device, and is suitably used for recording and reproducing information. The semiconductor laser driving device includes: a semiconductor laser for emitting a laser light; and a temperature detection unit for detecting a temperature of the semiconductor laser. The semiconductor laser driving device changes the output of the laser light based on the detected temperature. Thus, the semiconductor laser driving unit can suitably improve response characteristics of the semiconductor laser, irrespective of the temperature of the semiconductor laser. Therefore, the semiconductor laser driving device can ensure recording performance onto an optical disc without being affected by the temperature of the semiconductor laser.

10 Claims, 8 Drawing Sheets

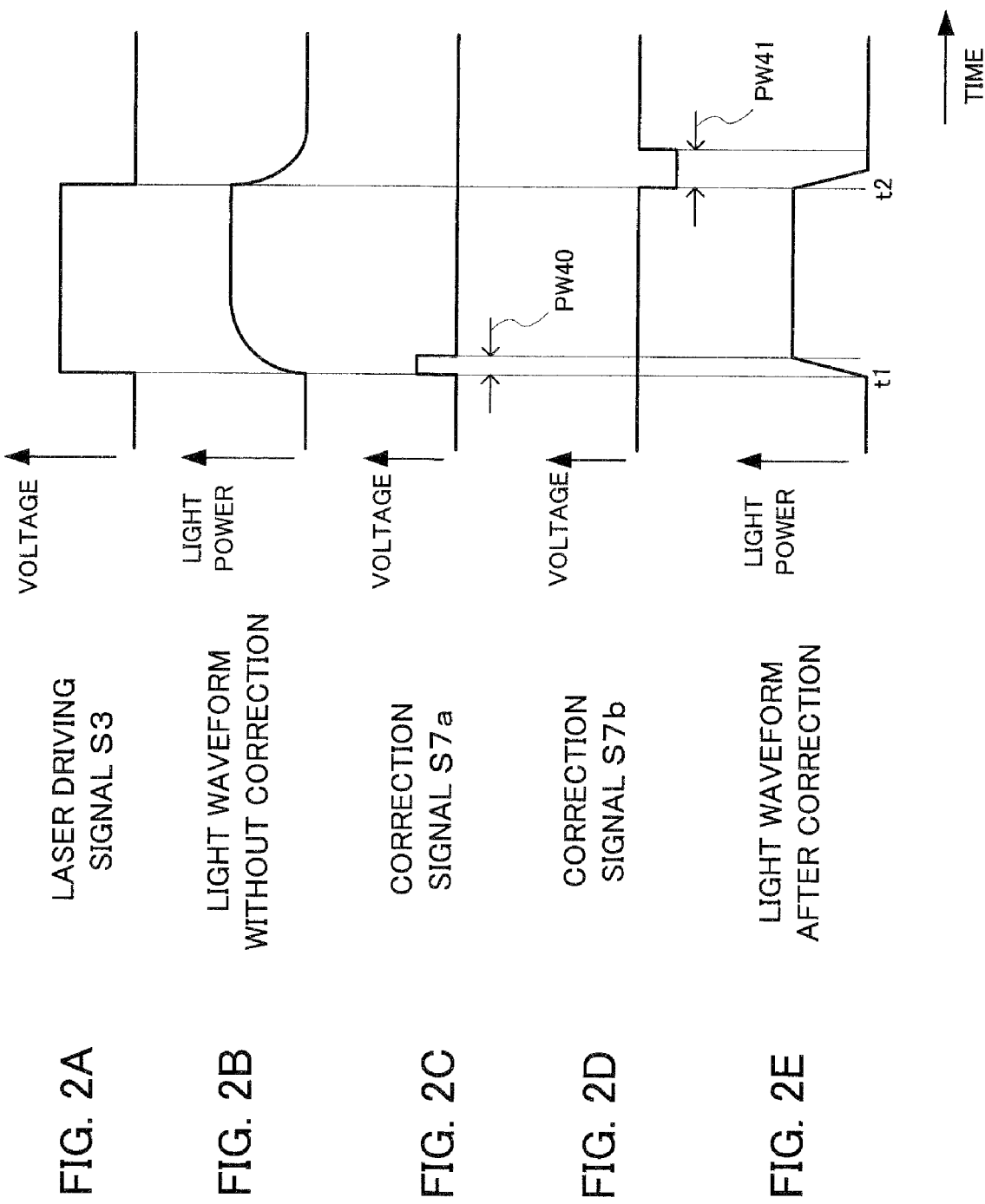

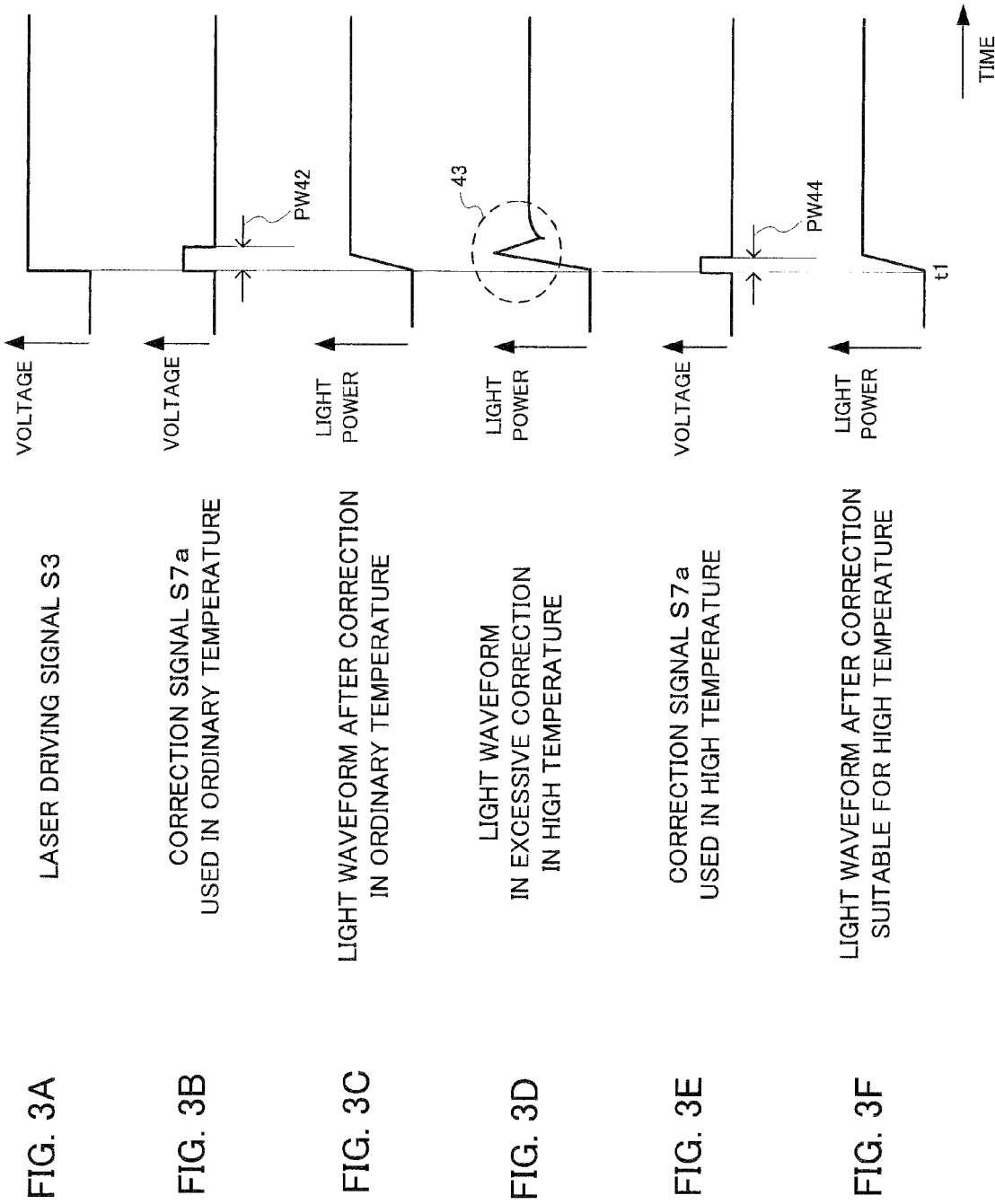

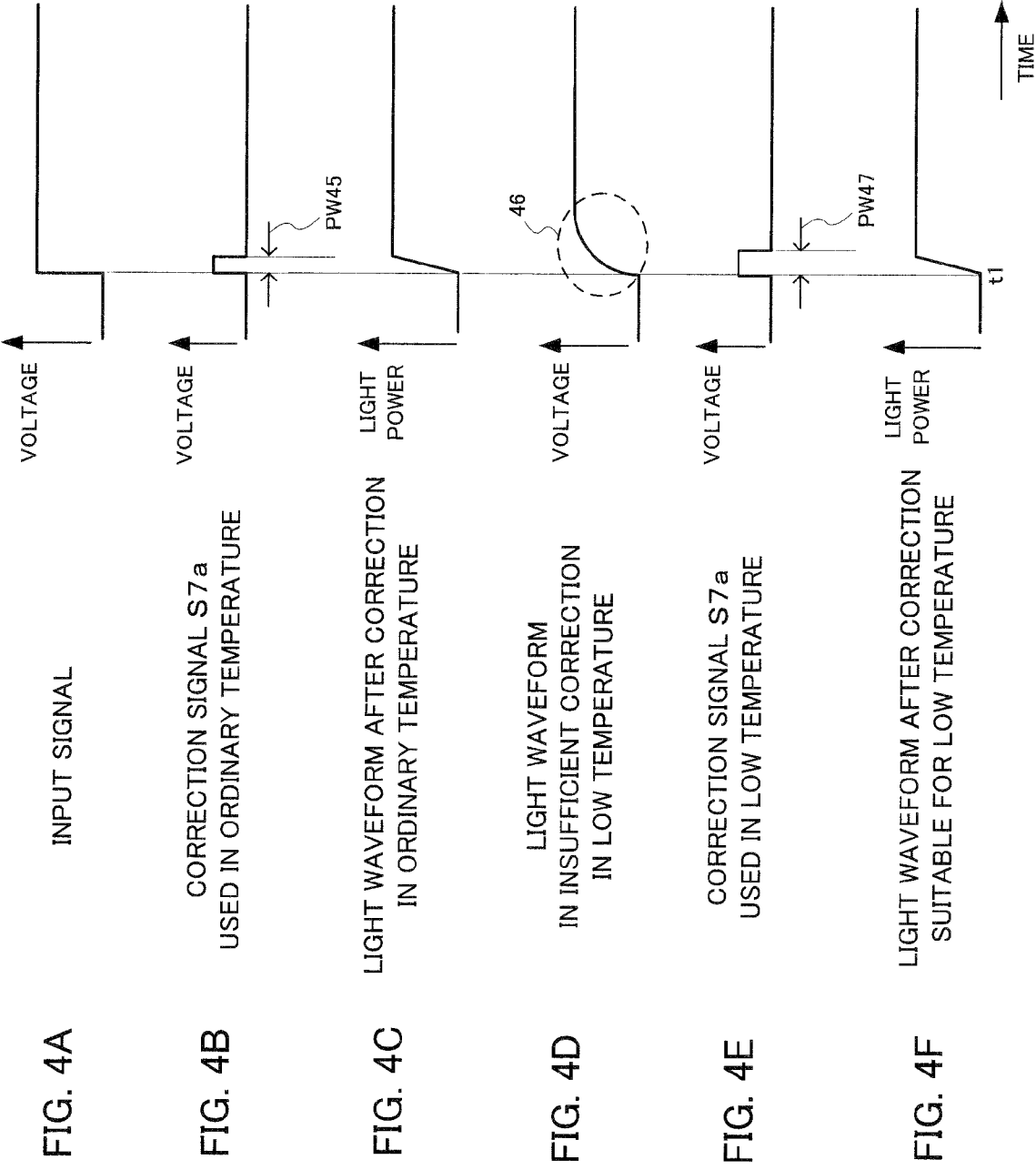

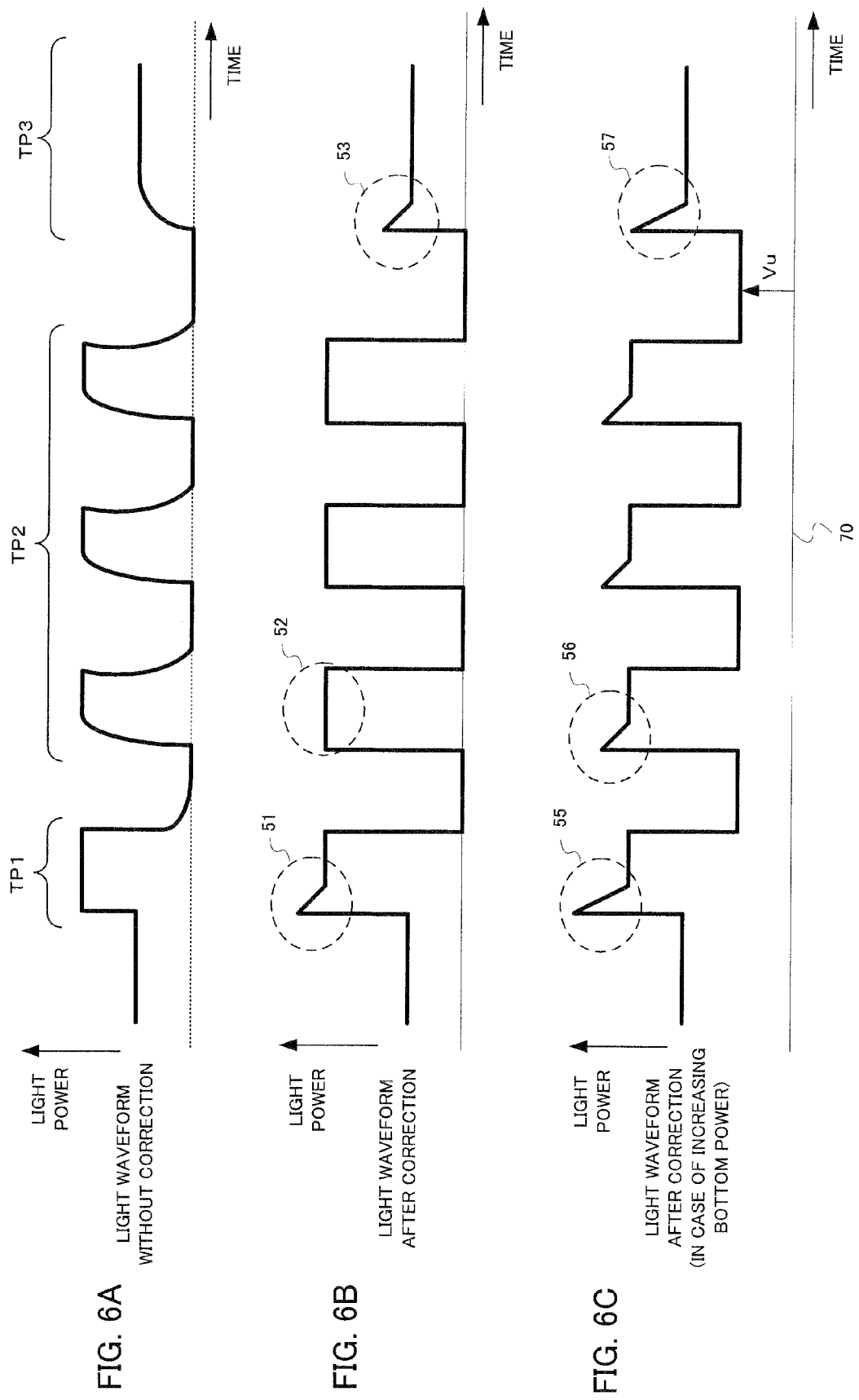

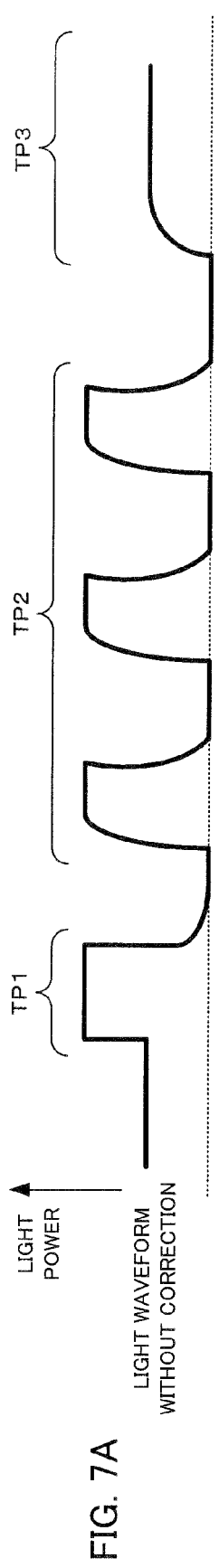
FIG. 7A LIGHT WAVEFORM WITHOUT CORRECTION
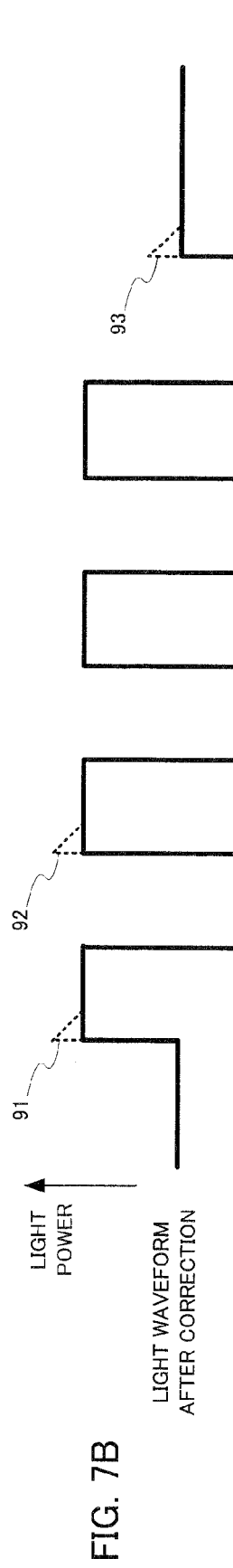
FIG. 7B LIGHT WAVEFORM AFTER CORRECTION
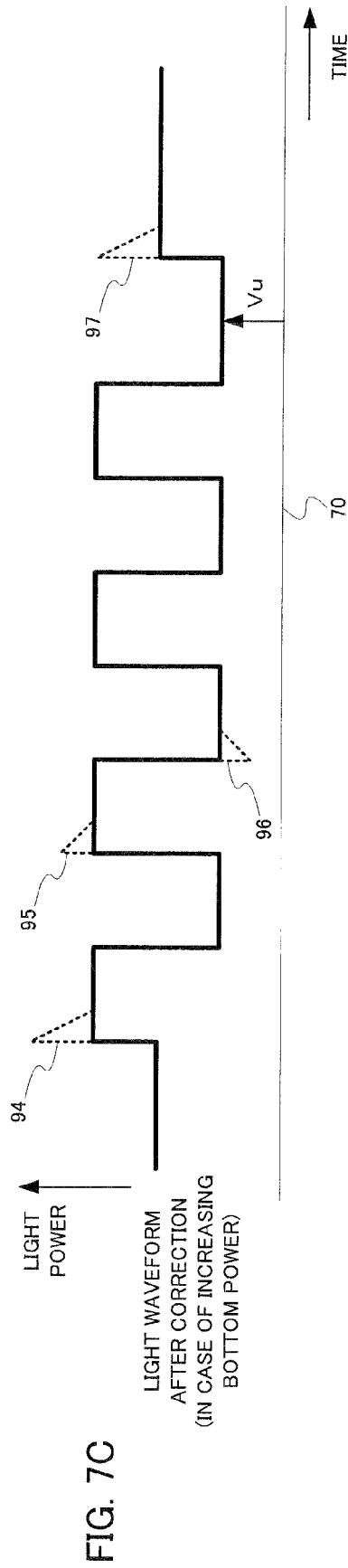
FIG. 7C LIGHT WAVEFORM AFTER CORRECTION (IN CASE OF INCREASING BOTTOM POWER)

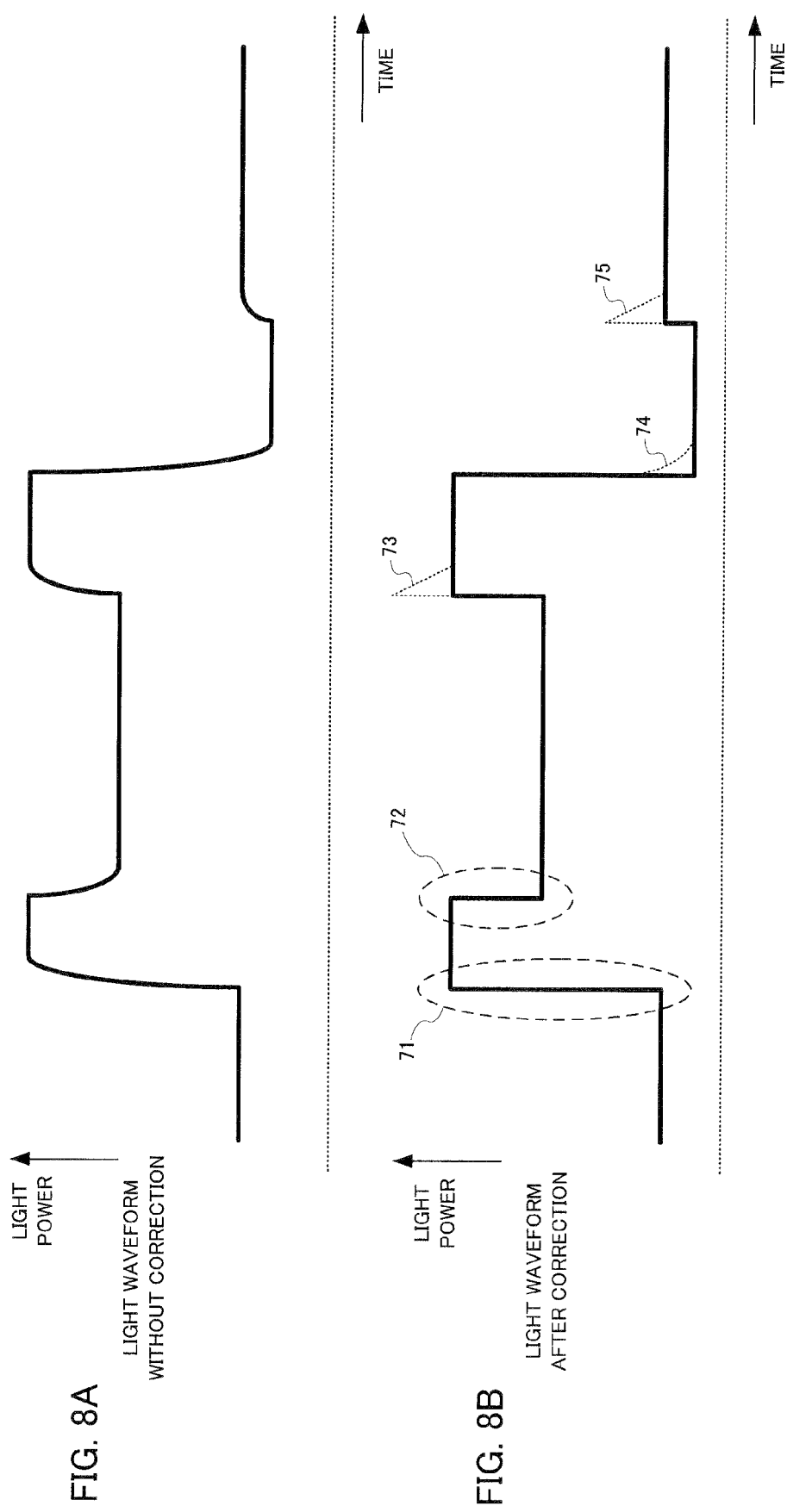

SEMICONDUCTOR LASER DRIVING DEVICE AND SEMICONDUCTOR LASER DRIVING METHOD

TECHNICAL FIELD

The present invention relates to a semiconductor laser driving device and a semiconductor laser driving method for driving a semiconductor laser.

BACKGROUND TECHNIQUE

Conventionally, it is known that rise-up and fall-down of a response of a semiconductor laser in correspondence with a laser driving signal are delayed by semiconductor laser characteristics and frequency characteristics of a semiconductor laser driving device. If the response is delayed, it sometimes becomes problematic that sufficient laser power necessary for recording onto an optical disc cannot be obtained and accurate recording becomes impossible.

Generally, there is known such a technique that the correction signal is superimposed on the laser driving signal and the semiconductor laser is driven by the superimposed signal in order to solve the problem. For example, Patent Reference-1 discloses such a technique that a differentiated laser signal is used as the correction signal and the correction signal is superimposed on the laser driving signal.

Patent Reference-1: Japanese Patent Application Laid-open under No. 2003-209319

By the way, it is known that, as for the semiconductor laser such as a blue laser diode, the response characteristics are changed by the temperature of the semiconductor laser. In addition, the laser power necessary for recording is different dependently on the number of recording layers of the optical disc for recording. For example, it is necessary that the laser driving signal having substantially double laser power of a one-layer optical disc is used for a two-layer optical disc.

However, in the technique disclosed in Patent Reference 1, since the correction signal is used without any change based on the temperature of the semiconductor laser and the number of recording layers of the optical disc, the suitable correction of the laser driving signal is not sometimes executed. For example, when the correction signal set in the ordinary temperature is used in the high temperature of the semiconductor laser, the excessive response is generated from the semiconductor laser, and ringing occurs to the laser light outputted from the semiconductor laser, which sometimes deteriorates recording performance. On the other hand, when the correction signal set in the ordinary temperature is used in the low temperature of the semiconductor laser, the sufficient correction is not executed, which sometimes deteriorates the recording performance.

DISCLOSURE OF INVENTION

Problem to be Solved by the Invention

The present invention has been achieved in order to solve the above problem. It is an object of this invention to provide a semiconductor laser driving device and a semiconductor laser driving method capable of appropriately correcting a laser driving signal for driving a semiconductor laser by generating a correction signal in consideration of the temperature of the semiconductor laser.

Means for Solving the Problem

According to one aspect of the present invention, there is provided a semiconductor laser driving device including: a semiconductor laser which emits a laser light; a temperature detection unit which detects a temperature of the semiconductor laser; a laser driving signal generating unit which generates a laser driving signal for driving the semiconductor laser; a correction signal generating unit which generates a correction signal used for correcting the laser driving signal based on the detected temperature; a correction unit which corrects the laser driving signal based on the correction signal; and a driving unit which drives the semiconductor laser based on the corrected laser driving signal, wherein output of the laser light is changed based on the detected temperature.

The above semiconductor laser driving device is loaded on an information recording and reproduction device, and is preferably used for recording information onto a recording medium such as an optical disc and for reproducing the information recorded onto the recording medium. Specifically, the semiconductor laser driving device changes the output of the laser light based on the temperature of the semiconductor laser detected by the temperature detection unit. In addition, the laser driving signal generating unit generates the laser driving signal for driving the semiconductor laser (e.g., a laser diode) for emitting the laser light, and the correction signal generating unit generates the correction signal used for correcting the laser driving signal. The correction unit corrects the laser driving signal based on the correction signal. The driving unit drives the semiconductor laser based on the laser driving signal. In this case, the correction signal generating unit generates the correction signal based on the temperature of the semiconductor laser detected by the temperature detection unit. Thereby, the semiconductor laser driving device can improve the response characteristics of the semiconductor laser irrespective of the temperature of the semiconductor laser. Thus, the semiconductor laser driving device can ensure the recording performance onto the optical disc without receiving the influence of the temperature of the semiconductor laser.

In a preferred example, the correction signal generating unit may set the correction signal to a reference correction amount when the detected temperature is a predetermined temperature. The correction signal generating unit may change the correction signal to a correction amount smaller than the reference correction amount when the detected temperature is higher than the predetermined temperature. The correction signal generating unit may change the correction signal to a correction amount larger than the reference correction amount when the detected temperature is lower than the predetermined temperature.

In a manner, the above semiconductor laser driving device may further include: a laser driving signal generating unit which generates a laser driving signal for driving the semiconductor laser; a correction signal generating unit which generates a correction signal used for correcting the laser driving signal based on the detected temperature; a correction unit which corrects the laser driving signal based on the correction signal; and a driving unit which drives the semiconductor laser based on the corrected laser driving signal.

In this manner, the correction signal generating unit generates the correction signal based on the change of the laser driving signal, and the correction unit corrects the laser driving signal based on the correction signal. The driving unit drives the semiconductor laser based on the corrected laser driving signal. Thereby, the semiconductor laser driving device can appropriately improve the response characteristics of the semiconductor laser irrespective of the change of the laser driving signal.

In a preferred example, the correction signal generating unit may set the correction signal to a reference correction amount when a change amount of the laser driving signal is a predetermined amount. The correction signal generating unit may change the correction signal to a correction amount larger than the reference correction amount when the change amount of the laser driving signal is equal to or larger than the predetermined amount. The correction signal generating unit may change the correction signal to a change amount smaller than the reference correction amount when the change amount of the laser driving signal is smaller than the predetermined amount.

In another manner of the above semiconductor laser driving device, the correction unit may correct the laser driving signal at a timing of rise-up of the laser driving signal and at a timing of fall-down of the laser driving signal. In this manner, it becomes possible to effectively speed up the response at the time of the rise-up and the fall-down of the semiconductor laser.

Preferably, the correction unit may correct the rise-up and the fall-down of the laser driving signal.

In a preferred example of the above semiconductor laser driving device, the correction signal may be a pulse signal, and the correction unit may superimpose the correction signal on the laser driving signal. The correction signal generating unit may change at least one of a pulse width of the correction signal, a timing of superimposing the correction signal on the laser driving signal and a level of the correction signal at a time of changing the correction signal.

In still another manner of the above semiconductor laser driving device, the correction signal generating unit may generate the correction signal based on a number of recording layers of a recording medium onto which the laser light is irradiated. In this manner, the semiconductor laser driving device changes the correction signal in such a case that the number of recording layers of the recording medium subjected to recording changes. Thereby, even if the number of recording layers of the recording medium changes and the laser power used for the recording also changes, the response characteristics of the semiconductor laser can be appropriately improved.

According to another aspect of the present invention, there is provided a semiconductor laser driving method including: a laser driving signal generating process which generates a laser driving signal for driving a semiconductor laser for emitting a laser light; a temperature detection process which detects a temperature of the semiconductor laser; a correction signal generating process which generates a correction signal used for correcting the laser driving signal based on the detected temperature; a correction process which corrects the laser driving signal based on the correction signal; and a driving process which drives the semiconductor laser based on the corrected laser driving signal. By the above semiconductor laser driving method, the response characteristics of the semiconductor laser can be appropriately improved irrespective of the temperature of the semiconductor laser, too.

According to still another aspect of the present invention, there is provided a semiconductor laser driving method including: a laser driving signal generating process which generates a laser driving signal for driving a semiconductor laser for emitting a laser light; a correction signal generating process which generates a correction signal used for correcting the laser driving signal based on a change of the laser driving signal; a correction process which corrects the laser driving signal based on the correction signal; and a driving process which drives the semiconductor laser based on the corrected laser driving signal. By the above semiconductor laser driving method, the response characteristics of the semiconductor laser can be appropriately improved irrespective of the change of the laser driving signal.

BRIEF DESCRIPTION OF THE DRAWINGS

FIGS. 2A to 2E show concrete examples such as a response light waveform of a laser diode;

FIGS. 3A to 3F show concrete examples of a correction signal used in such a case that the laser diode is in a high temperature;

FIGS. 4A to 4F show concrete examples of the correction signal used in such a case that the laser diode is in a low temperature;

FIGS. 6A to 6C show the response light waveforms of the laser diode in such a case that the laser diode is driven by a fixed correction signal;

FIGS. 7A to 7C show the response light waveforms of the laser diode in such a case that the laser diode is driven by the correction signal changed in correspondence with the laser driving signal; and FIGS. 8A and 8B show the response light waveforms of the laser diode in such a case that correction is executed to the laser driving signal having a shape different from that of the laser driving signal shown in FIGS. 7A to 7C.

BRIEF DESCRIPTION OF THE REFERENCE NUMBER

Figure 1:
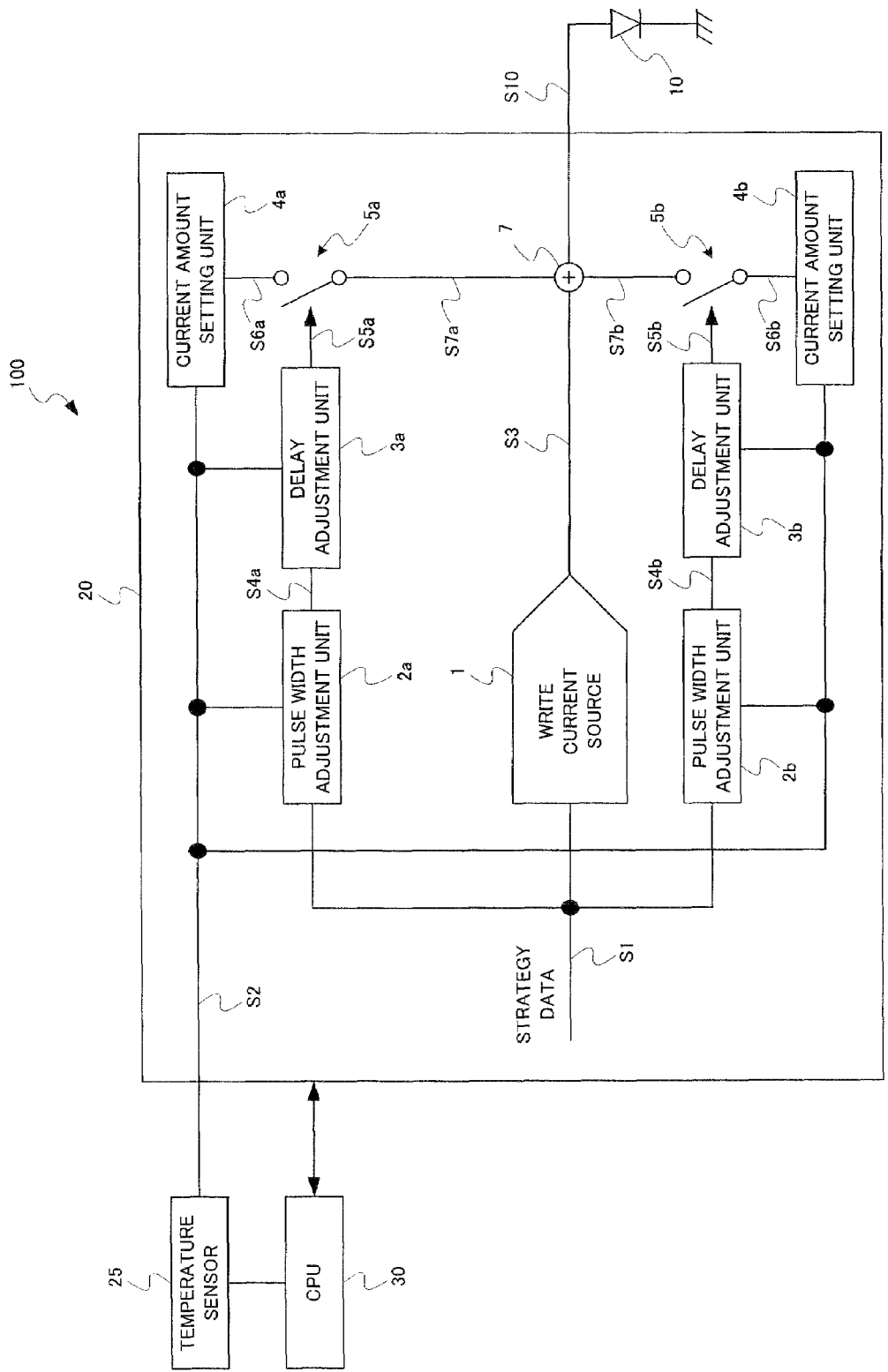
FIG. 1 is a block diagram schematically showing a configuration of an information recording and reproduction device according to a first embodiment of the present invention.

1 Write current source
2a, 2b Pulse width adjustment units
3a, 3b Delay adjustment units
4a, 4b Current amount setting units
7 Adder
8 APC
10 Laser diode
15 Front monitor
20, 21 Semiconductor laser driving devices
25 Temperature sensor
30 CPU
100, 101 Information recording and reproduction devices

DETAILED DESCRIPTION OF THE PREFERRED EMBODIMENTS

The preferred embodiments of the present invention will now be described below with reference to the attached drawings.

First Embodiment

First, a description will be given of a configuration of an information recording and reproduction device according to a first embodiment of the present invention with reference to FIG. 1.

FIG. 1 is a block diagram schematically showing a configuration of an information recording and reproduction device 100. The information recording and reproduction device 100 mainly includes a laser diode (LD) 10, a semiconductor laser driving device 20, a temperature sensor 25 and a CPU 30. Concretely, the semiconductor laser driving device 20 includes a write current source 1, pulse width adjustment units 2a and 2b, delay adjustment units 3a and 3b, current amount setting units 4a and 4b, switch units 5a and 5b and an adder 7. The information recording and reproduction device 100 reproduces information recorded on an optical disc (not shown) and records information onto an optical disc.

The laser diode 10 is a semiconductor laser, and emits a laser light onto the optical disc (not shown). Concretely, the laser diode 10 obtains a signal S10 from the semiconductor laser driving device 20, and outputs the laser light having the laser power corresponding to the signal S10. The laser diode 10 can be formed by a blue laser diode, for example.

The temperature sensor 25 detects the temperature of the laser diode 10, and supplies, to the semiconductor laser driving device 20, a signal S2 corresponding to the detected temperature. Concretely, the temperature sensor 25 supplies the signal S2 to the pulse width adjustment units 2a and 2b, the delay adjustment units 3a and 3b and the current amount setting units 4a and 4b.

The write current source 1 in the semiconductor laser driving device 20 obtains strategy data S1 from the outside. The strategy data S1 includes information for recording the information onto the optical disc. Based on the obtained strategy data S1, the write current source 1 generates a laser driving signal S3 for driving the laser diode 10, and outputs the laser driving signal S3. The strategy data S1 is also supplied to the pulse width adjustment units 2a and 2b.

Next, a description will be given of processes executed in the pulse width adjustment units 2a and 2b, the delay adjustment units 3a and 3b and the current amount setting units 4a and 4b. These processing units generate a correction signal for correcting the laser driving signal S3 generated by the write current source 1. The correction signal is used for improving response characteristics of the laser diode 10. Concretely, the correction signal is used for increasing the speed of the rise-up and fall-down of the response of the laser diode 10 by the laser driving signal S3. Specifically, the pulse width adjustment unit 2a, the delay adjustment unit 3a and the current amount setting unit 4a generate a correction signal S7a superimposed on the laser driving signal S3 at the time of the rise-up of the laser driving signal S3. Meanwhile, the pulse width adjustment unit 2b, the delay adjustment unit 3b and the current amount setting unit 4b generate a correction signal S7b superimposed on the laser driving signal S3 at the time of the fall-down of the laser driving signal S3.

As described above, the pulse width adjustment units 2a and 2b, the delay adjustment units 3a and 3b and the current amount setting units 4a and 4b function as correction signal generating units and correction units. Concretely, the pulse width adjustment units 2a and 2b execute a process of changing the pulse width of the correction signal. The delay adjustment units 3a and 3b execute a process of changing a timing of inputting the correction signal at a start timing and an end timing of the laser driving signal S3. The current amount setting units 4a and 4b change the current amount which is set to the correction signal. Hereinafter, the amount changed by the pulse width adjustment units 2a and 2b, the delay adjustment units 3a and 3b and the current amount setting units 4a and 4b are totally referred to as "correction amount".

Moreover, in the first embodiment, the pulse width adjustment units 2a and 2b, the delay adjustment units 3a and 3b and the current amount setting units 4a and 4b obtain, from the temperature sensor 25, the signal S2 corresponding to the temperature of the laser diode 10, and generates the correction signal based on the temperature of the laser diode 10. Concretely, the processing units execute the process of reducing the correction amount set to the correction signal when the temperature of the laser diode 10 is higher than the ordinary temperature. Meanwhile, the processing units execute the process of increasing the correction amount set to the correction signal when the temperature of the laser diode 10 is lower than the ordinary temperature. Specifically, by prescribing the correction amount set to the correction signal in the ordinary temperature of the laser diode 10 as a reference, the pulse width adjustment units 2a and 2b, the delay adjustment units 3a and 3b and the current amount setting units 4a and 4b execute the process of changing the correction amount with respect to the reference, based on the temperature of the laser diode 10. Hereinafter, the correction amount prescribed as the reference is also referred to as "reference correction amount". Moreover, changing the correction amount with respect to the reference correction amount in order to increase the correction amount of the laser driving signal S3 is referred to as "increasing the correction amount". Meanwhile, changing the reference correction amount in order to reduce the correction amount of the laser driving signal S3 is referred to as "reducing the correction amount".

Next, a description will be given of the concrete processes executed in the pulse width adjustment units 2a and 2b, the delay adjustment units 3a and 3b and the current amount setting units 4a and 4b. The pulse width adjustment units 2a and 2b obtain the strategy data S1 supplied from the outside and the signal S2 corresponding to the temperature of the laser diode 10 supplied from the temperature sensor 25. The pulse width adjustment units 2a and 2b adjust the pulse width of the correction signal, based on the temperature of the laser diode 10. Concretely, when the temperature of the laser diode 10 is higher than the ordinary temperature, the pulse width adjustment units 2a and 2b narrow the pulse width which is set in the ordinary temperature. Meanwhile, when the temperature of the laser diode 10 is lower than the ordinary temperature, the pulse width adjustment units 2a and 2b widen the pulse width which is set in the ordinary temperature. As the different amount between the temperature of the laser diode 10 and the ordinary temperature becomes larger, the pulse width adjustment units 2a and 2b perform the larger change of the pulse width set in the ordinary temperature. When the above process ends, the pulse width adjustment units 2a and 2b output signals S4a and S4b corresponding to the pulse width after the adjustment.

The delay adjustment units 3a and 3b obtain the signal S2 supplied from the temperature sensor 25 and the signals S4a and S4b supplied from the pulse width adjustment units 2a and 2b. Based on the temperature of the laser diode 10, the delay adjustment units 3a and 3b adjust the timing of inputting the correction signal at the start timing and the end timing of the laser driving signal S3. Namely, the delay adjustment units 3a and 3b adjust the delay amount at the timing of inputting the correction signal in correspondence with the start timing and the end timing of the laser driving signal S3.

Concretely, if the temperature of the laser diode 10 is higher than the ordinary temperature, the delay adjustment unit 3a accelerates the timing of inputting the correction signal so that the response speed at the time of the rise-up of the laser diode 10 does not become fast. Meanwhile, if the temperature of the laser diode 10 is lower than the ordinary temperature, the delay adjustment unit 3a decelerates the timing of inputting the correction signal so that the response speed at the time of the rise-up of the laser diode 10 becomes fast. This is because, by inputting the correction signal in the vicinity of the end of the rise-up of the laser driving signal S3, the response speed of the laser diode 10 can be effectively fast. Further, if the temperature of the laser diode 10 is higher than the ordinary temperature, the delay adjustment unit 3b decelerates the timing of inputting the correction signal so that the response speed at the time of the fall-down of the laser diode 10 does not become fast. Meanwhile, if the temperature of the laser diode 10 is lower than the ordinary temperature, the delay adjustment unit 3b accelerates the timing of inputting the correction signal so that the response speed at the time of the fall-down of the laser diode 10 becomes fast. As the different amount between the temperature of the laser diode 10 and the ordinary temperature becomes larger, the delay adjustment units 3a and 3b perform the larger change of the delay amount set in the ordinary temperature. When the above process ends, the delay adjustment units 3a and 3b output signals S5a and S5b corresponding to the obtained delay amount.

The current amount setting units 4a and 4b obtain the signal S2 supplied from the temperature sensor 25. Based on the temperature of the laser diode 10, the current amount setting units 4a and 4b adjust the current amount which is set to the correction signal. By adjusting the current amount, the height of the pulse is changed. Concretely, if the temperature of the laser diode 10 is higher than the ordinary temperature, the current amount setting units 4a and 4b reduce the current amount which is set in the ordinary temperature. Meanwhile, if the temperature of the laser diode 10 is lower than the ordinary temperature, the current amount setting units 4a and 4b increase the current amount which is set in the ordinary temperature. When the above process ends, the current amount setting units 4a and 4b output signals S6a and S6b corresponding to the set current amount. As the different amount between the temperature of the laser diode 10 and the ordinary temperature becomes larger, the current amount setting units 4a and 4b perform the larger change of the current amount which is set in the ordinary temperature.

The switch units 5a and 5b switch ON/OFF states of the switches, based on the signals S5a and S5b supplied from the delay adjustment units 3a and 3b. Namely, the switch units 5a and 5b execute switching, based on the signals S5a and S5b showing the timing of inputting the correction signal, out putted from the delay adjustment units 3a and 3b. When the switch units 5a and 5b are set to the ON state, the correction signals S7a and S7b in which the pulse width and the current amount are set are inputted to the adder 7.

The laser driving signal S3 and the correction signals S7a and S7b are supplied to the adder 7. The adder 7 executes a process of adding the supplied laser driving signal S3 and the correction signal S7a or S7b. Then, the adder 7 supplies the signal S10 after addition to the laser diode 10. Thus, the laser diode 10 is driven by the signal S10 formed by superimposing the correction signals S7a and S7b on the laser driving signal S3.

In the above change of the correction amount, it is unnecessary that all of the pulse width, the delay amount and the current amount are changed. Namely, if at least one of the pulse width, the delay amount and the current amount is changed, the above change of the correction amount can be executed.

The CPU 30 supplies a set value to the above various kinds of processing units, and controls each of the processing units.

FIGS. 2A to 2E show concrete examples of the response waveform of the laser diode 10 in such a case that the correction is executed with using the above correction signals S7a and S7b. In FIGS. 2A to 2E, the horizontal axis shows time. In FIG. 2A, FIG. 2C and FIG. 2D, the vertical axis shows voltage, and in FIG. 2B and FIG. 2E, the vertical axis shows the intensity of the light power.

FIG. 2A shows the laser driving signal S3 outputted from the write current source 1. FIG. 2B shows a response light waveform of the laser diode 10 in such a case that the laser diode 10 is driven by the laser driving signal S3 on which the correction signals S7a and S7b are not superimposed. Thereby, when the correction signals S7a and S7b are not used, it is understood that the speed of the rise-up and fall-down of the response of the laser diode 10 is slow.

FIGS. 2C and 2D show the correction signals S7a and S7b used for the laser driving signal S3 shown in FIG. 2A. FIG. 2C shows the correction signal S7a used at the start timing of the laser driving signal S3. In this case, the correction signal S7a is set to a pulse width PW40. In addition, the correction signal S7a is set to the delay amount "0". Namely, the correction signal S7a is inputted to the laser diode 10 at the same timing as the start timing t1 of the laser driving signal S3.

Meanwhile, FIG. 2D shows the correction signal S7b used at the end timing of the laser driving signal S3. In this case, the correction signal S7b is set to the pulse width PW41 (PW40<PW41). In addition, the correction signal S7b is set to the delay amount "0". Namely, the correction signal S7b is inputted into the laser diode 10 at the same timing as the end timing t2 of the laser driving signal S3.

By driving the laser diode 10 by the signal obtained by superimposing the above correction signals S7a and S7b on the laser driving signal S3, the response light waveform shown in FIG. 2E is obtained from the laser diode 10. Thereby, it is understood that the speed of the rise-up and fall-down of the laser diode 10 becomes fast and the response characteristics of the laser diode 10 corresponding to the laser driving signal S3 is improved.

Next, a description will be given of the correction signal S7a used in such a case that the temperature of the laser diode 10 is high or low, with reference to FIGS. 3A to 3F and FIGS. 4A to 4F. Now, a description will be given of examples of changing the pulse width of the correction signal based on the temperature of the laser diode 10.

FIGS. 3A to 3F show concrete examples of the correction signal S7a used in such a case that the laser diode 10 is in the high temperature. In FIGS. 3A to 3F, the horizontal axis shows time. In FIGS. 3A, 3B and 3E, the vertical axis shows the voltage, and in FIGS. 3C, 3D and 3F, the vertical axis shows the intensity of the light power.

FIG. 3A shows the laser driving signal S3 outputted from the write current source 1. FIG. 3B shows the correction signal S7a set in the ordinary temperature. The correction signal S7a is set based on the laser diode 10 in the ordinary temperature, and the pulse width is set to PW42. The pulse width PW42 is used as the reference correction amount. When the laser diode 10 is in the ordinary temperature, if the laser diode 10 is driven by the signal on which the correction signal S7a shown in FIG. 3B is superimposed, the response light waveform shown in FIG. 3C is obtained from the laser diode 10. Thereby, it is understood that the speed of the rise-up of the laser diode 10 is fast and the response characteristics are improved.

On the other hand, when the temperature of the laser diode 10 is higher than the ordinary temperature, if the laser diode 10 is driven by the correction signal S7a (the correction signal S7a shown in FIG. 3B) set to the reference correction amount, the response light waveform shown in FIG. 3D is obtained from the laser diode 10. Thereby, as shown in a broken-line area 43, it is understood that the laser diode 10 indicates the excessive response. Namely, the laser diode 10 outputs the laser light including the laser power equal to or larger than the laser power to be outputted. Since the excessive correction is executed by the correction signal S7a set to the reference correction amount, the excessive response occurs. Specifically, since the pulse width PW42 corresponding to the reference correction amount is larger than the pulse width to be set in order to appropriately correct the laser diode 10 in the high temperature, the excessive response occurs. When the excessive response occurs, ringing occurs to the laser light outputted from the laser diode 10, and the writing performance onto the optical disc deteriorates.

Therefore, the semiconductor laser driving device 20 according to the first embodiment generates the correction signal, based on the temperature of the laser diode 10. Namely, the semiconductor laser driving device 20 according to the first embodiment changes the reference correction amount set in the ordinary temperature in correspondence with the temperature of the laser diode 10, and generates the correction signal set to the changed correction amount. Concretely, the semiconductor laser driving device 20 generates the correction signal S7a shown in FIG. 3E. In this case, the pulse width PW44 of the correction signal S7a is narrower than the pulse width PW42 corresponding to the reference correction amount. The pulse width is set in this manner so that the correction amount of the laser driving signal S3 by the correction signal S7a is smaller than the correction amount of the laser driving signal S3 by the correction signal S7a set to the reference correction amount because the temperature of the laser diode 10 is high. By driving the laser diode 10 with using the correction signal S7a thus set, the response light waveform shown in FIG. 3F is obtained from the laser diode 10. Thereby, even if the temperature of the laser diode 10 is high, it is understood that the response characteristics at the time of the rise-up are appropriately improved.

FIGS. 4A to 4F show concrete examples of the correction signal S7a used in such a case that the temperature of the laser diode 10 is low. In FIGS. 4A to 4F, the horizontal axis shows time. In FIGS. 4A, 4B and 4E, the vertical axis shows the voltage, and in FIGS. 4C, 4D and 4F, the vertical axis shows the intensity of the light power.

FIG. 4A shows the laser driving signal S3 outputted from the write current source 1. FIG. 4B shows the correction signal S7a set in the ordinary temperature. The correction signal S7a is set based on the laser diode 10 in the ordinary temperature, and the pulse width is set to the amount shown by PW45. The pulse width PW45 is used as the reference correction amount. When the laser diode 10 is in the ordinary temperature, if the laser diode 10 is driven by the signal on which the correction signal S7a shown in FIG. 4B is superimposed, the response light waveform shown in FIG. 4C is obtained from the laser diode 10. Thereby, it is understood that the speed of the rise-up of the laser diode 10 is fast and the response characteristics are improved.

On the other hand, when the temperature of the laser diode 10 is lower than the ordinary temperature, if the laser diode 10 is driven by the correction signal S7a (the correction signal S7a shown in FIG. 4B) set to the reference correction amount, the response light waveform shown in FIG. 4D is obtained from the laser diode 10. Thereby, it is understood that the speed at the time of the rise-up of the response of the laser diode 10 is slow, as shown in a broken-line area 46. Since the correction amount is insufficient and the sufficient correction cannot be executed in the correction signal S7a set to the reference correction amount, this response occurs. Namely, since the pulse width PW45 corresponding to the reference correction amount is narrower than the pulse width to be set in order to appropriately correct the laser diode 10 in the low temperature, this response occurs. When such a response occurs, the recording power onto the optical disc becomes insufficient, and the writing performance deteriorates.

In this case, the semiconductor laser driving device 20 according to the first embodiment changes the reference correction amount set in the ordinary temperature in correspondence with the temperature of the laser diode 10, and generates the correction signal set to the changed correction amount. Concretely, the semiconductor laser driving device 20 generates the correction signal S7a shown in FIG. 4E. In this case, the pulse width PW47 in the correction signal S7a is wider than the pulse width PW45 corresponding to the reference correction amount. The pulse width is set in this manner so that the correction amount of the laser signal S3 by the correction signal S7a becomes larger than the correction amount of the laser driving signal S3 by the correction signal S7a set to the reference correction amount because the temperature of the laser diode 10 is low. By driving the laser diode 10 with using the correction signal S7a thus set, the response light waveform shown in FIG. 4F is obtained from the laser diode 10. Thereby, it is understood that, even when the laser diode 10 is in the low temperature, the response characteristics at the time of the rise-up are appropriately improved.

As described above, the semiconductor laser driving device 20 according to the first embodiment generates the correction signal for improving the response characteristics of the laser diode 10, based on the temperature of the laser diode 10. Thereby, even when the temperature of the laser diode 10 changes, it becomes possible to appropriately improve the response characteristics of the laser diode 10. Therefore, the semiconductor laser driving device 20 can ensure the recording performance onto the optical disc without receiving the effect of the temperature of the laser diode 10.

Second Embodiment

Next, a description will be given of a second embodiment of the present invention.

The semiconductor laser driving device according to the second embodiment is different from the above semiconductor laser driving device 20 according to the first embodiment in that the semiconductor laser driving device according to the second embodiment generates the correction signals S7a and S7b based on the change of the laser driving signal S3, instead of the temperature of the laser diode 10. Since the laser diode 10 has such load characteristics that a resistance value changes in correspondence with the laser power and thus the correction signals S7a and S7b have to be generated in correspondence with the laser power, the correction signals S7a and S7b are generated based on the change of the laser driving signal S3. Basically, the resistance value of the laser diode 10 is large in such a case that the laser power is small, and the resistance value thereof is small in such a case that the laser power is large.

Figures 5A, 5B:
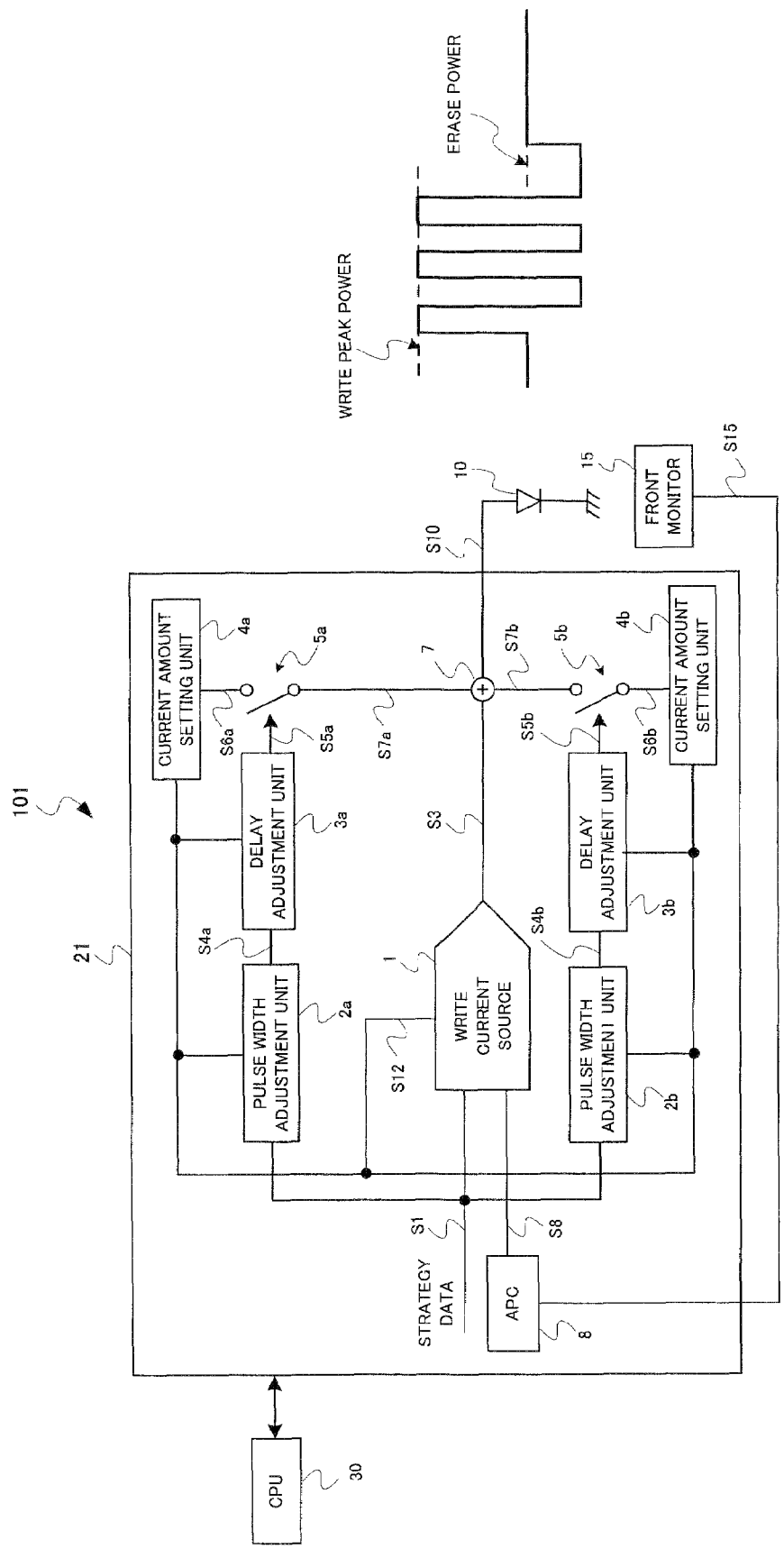
FIG. 5A is a block diagram schematically showing a configuration of the information recording and reproduction device according to a second embodiment of the present invention.
FIG. 5B shows an example of a write peak power and an erase power in a light waveform of the laser diode.

FIG. 5A is a block diagram schematically showing a configuration of an information recording and reproduction device 101 according to the second embodiment. The information recording and reproduction device 101 is structurally different from the above-mentioned information recording and reproduction device 100 in that the information recording and reproduction device 101 does not include the temperature sensor 25 and does include a front monitor (FM) 15 and a semiconductor laser driving device 21 instead of the semiconductor laser driving device 20. In addition, the semiconductor laser driving device 21 is structurally different from the semiconductor laser driving device 20 in that the semiconductor laser driving device 21 includes an APC (Automatic Power Control) 8. In the information recording and reproduction device 101, the same reference numerals are given to the same components and signals as those of the above-mentioned information recording and reproduction device 100, and explanations thereof are omitted.

The front monitor 15 is a monitor diode for detecting the light amount of the laser diode 10, and supplies the light amount of the detected laser diode 10 to the APC 8 as a signal S15. The APC 8 samples or peak-holds the write peak power and the erase power based on the supplied signal S15, and outputs the signal for correcting the error with respect to the target value. FIG. 5B shows an example of the write peak power and the erase power in the light waveform of the laser diode 10. As for a read power, the APC 8 also outputs the signal for correcting the error with respect to the target value. The APC 8 supplies, to the write current source 1, a signal S8 including the signal for correcting the error of the write peak power, the erase power and the read power. By the process executed in the APC 8, the output power of the laser diode 10 can be appropriately adjusted.

Next, a description will be given of a process for generating the correction signal executed in the semiconductor laser driving device 21.

The pulse width adjustment units 2a and 2b, the delay adjustment units 3a and 3b and the current amount setting units 4a and 4b generate the correction signal based on a signal S12 supplied from the write current source 1. In the second embodiment, the write current source 1 generates the laser driving signal S3 from the inputted strategy data S1, and calculates the change amount of the generated laser driving signal S3 to output the signal S12 corresponding to the change amount. Concretely, the write current source 1 calculates the change amount of the laser driving signal S3 during a predetermined time period. Then, the pulse width adjustment units 2a and 2b, the delay adjustment units 3a and 3b and the current amount setting units 4a and 4b execute the process of changing the correction amount which is set to the correction signal based on the change amount serving as a reference in the laser driving signal S3. The correction amount which is set based on the change amount being the reference corresponds to the above-mentioned reference correction amount. Hereinafter, the correction amount which is set based on the change amount being the reference is used as the reference correction amount.

Concretely, the pulse width adjustment units 2a and 2b obtain the strategy data S1 supplied from the outside and the signal S12 supplied from the write current source 1. The pulse width adjustment units 2a and 2b adjust the pulse width of the correction signal based on the change amount of the laser driving signal S3. Concretely, if the change amount of the laser driving signal S3 is small, the pulse width adjustment units 2a and 2b perform the change of narrowing the pulse width corresponding to the reference correction amount. Meanwhile, if the change amount is large, the pulse width adjustment units 2a and 2b perform the change of widening the pulse width corresponding to the reference correction amount. When the above process ends, the pulse width adjustment units 2a and 2b output the signals S4a and S4b corresponding to the changed pulse width. As the different amount between the change amount of the laser driving signal S3 and the change amount being the reference becomes larger, the pulse width adjustment units 2a and 2b largely change the pulse width corresponding to the reference correction amount.

The delay adjustment units 3a and 3b obtain the signal S12 supplied from the write current source 1 and the signals S4a and S4b supplied from the pulse width adjustment units 2a and 2b. Based on the change amount of the laser driving signal S3, the delay adjustment units 3a and 3b adjust the delay amount of timing of inputting the correction signal in correspondence with the start timing and end timing of the laser driving signal S3. Concretely, if the change amount of the laser driving signal S3 is small, the delay adjustment unit 3a accelerates the timing of inputting the correction signal so that the response speed at the time of the rise-up of the laser diode 10 does not become fast. Meanwhile, if the change amount is large, the delay adjustment unit 3a decelerates the timing of inputting the correction signal so that the response speed at the time of the rise-up of the laser diode 10 becomes fast. Further, if the change amount is small, the delay adjustment unit 3b decelerates the timing of inputting the correction signal so that the response speed at the time of the fall-down of the laser diode 10 does not become fast. Meanwhile, if the change amount is large, the delay adjustment unit 3b accelerates the timing of inputting the correction signal so that the response speed at the time of the fall-down of the laser diode 10 becomes fast. When the above process ends, the delay adjustment units 3a and 3b output the signals S5a and S5b corresponding to the obtained delay amount. As the different amount between the change amount of the laser driving signal S3 and the change amount being the reference becomes larger, the delay adjustment units 3a and 3b perform the larger change of the delay amount corresponding to the reference correction amount.

The current amount setting units 4a and 4b obtain the signal S12 supplied from the write current source 1. Based on the change amount of the laser driving signal S3, the current amount setting units 4a and 4b adjust the current amount which is set to the correction signal. Concretely, if the change amount is small, the current amount setting units 4a and 4b perform the change of reducing the current amount corresponding to the reference correction amount. Meanwhile, if the change amount is large, the current amount setting units 4a and 4b perform the change of increasing the current amount corresponding to the reference correction amount. When the above process ends, the current amount setting units 4a and 4b output the signals S6a and S6b corresponding to the set current amount. As the different amount between the change amount of the laser driving signal S3 and the change amount being the reference becomes larger, the current amount setting units 4a and 4b perform the larger change of the current amount corresponding to the reference correction amount.

The correction signals S7a and S7b generated in the pulse width adjustment units 2a and 2b, the delay adjustment units 3a and 3b and the current amount setting units 4a and 4b are superimposed on the laser driving signal S3 in the adder 7. In the above-mentioned change of the correction amount, it is unnecessary that all of the pulse width, the delay amount and the current amount are changed. Namely, by changing at least one of the pulse width, the delay amount and the current amount, the change of the correction amount becomes possible.

Now, a description will be given of a problem in such a case that the laser diode 10 is driven by the correction signals S7a and S7b generated irrespective of the change amount of the laser driving signal S3, with reference to FIGS. 6A to 6C. In FIGS. 6A to 6C, the horizontal axis shows time, and the vertical axis shows a light power.

FIGS. 6A to 6C show a top pulse section TP1, a multi pulse section TP2 and a space section TP3, from left to right in this order. FIG. 6A shows the response light waveform of the laser diode 10 in the case of executing the driving by the laser driving signal S3 on which the correction signals S7a and S7b are not superimposed. Thereby, it is understood that the speed of the rise-up of the response of the laser diode 10 is fast in the top pulse section TP1 but the speed of the rise-up and fall-down of the response of the laser diode 10 is slow in the multi pulse section TP2.

FIG. 6B shows the response light waveform of the laser diode 10 after the correction with using the correction signals S7a and S7b. In this case, the correction signal S7a is set based on the change amount of the laser driving signal S3 corresponding to the multi pulse. Namely, the correction amount which is set to the correction signal S7a corresponds to the reference correction amount. The correction signal S7a is not changed based on the change amount of the laser driving signal S3, and is fixed. Namely, the correction signal S7 is always set to the reference correction amount.

When the correction is executed with using the correction signal S7a set in the above manner, as shown by a broken-line area 51 shown in FIG. 6B, it is understood that the laser diode 10 indicates the excessive response at the time of the rise-up of the top pulse. Namely, the laser diode 10 outputs the laser light having the laser power equal to or larger than the laser power to be outputted. The reason why the excessive response is shown will be explained. In the correction signal S7a set to the reference correction amount, the excessive response occurs because the laser driving signal S3 corresponding to the top pulse is extremely larger than the amount to be appropriately corrected. The rise-up of the laser driving signal S3 corresponding to the top pulse starts at the comparatively high power, and the change amount of the rise-up of the laser driving signal S3 corresponding to the top pulse is smaller than that of the laser driving signal S3 corresponding to the multi pulse. Therefore, the excessive response occurs. Meanwhile, it is understood that the appropriate correction is executed in the multi pulse section TP2 shown by a broken-line area 52. This is because the reference correction amount is set based on the laser driving signal S3 corresponding to the multi pulse.

Moreover, even when the correction of the laser driving signal S3 in the space section TP3 is executed with using the correction signal S7a, it is understood that the laser diode 10 indicates the excessive response, as shown by a broken-line area 53 shown in FIG. 6B. Since the correction amount of the laser driving signal S3 by the correction signal S7a set to the reference correction amount is larger than the correction amount of the laser driving signal S3 in the space section TP3, the excessive response occurs. The laser power of the laser driving signal S3 in the space section TP3 is small, the change amount at the time of the rise-up of the laser driving signal S3 in the space section TP3 is smaller than that of the laser driving signal S3 corresponding to the multi pulse. Therefore, the excessive response occurs.

FIG. 6C shows the response light waveform of the laser diode 10 after the correction in such a case that the laser driving signal S3 is increased from the bottom power 70 by the light power Vu (hereinafter referred to as "increased bottom power time"). In this case, the reference correction amount is set based on the laser driving signal S3 corresponding to the multi pulse in such a case that the laser driving signal S3 is not increased from the bottom power 70 (hereinafter referred to as "ordinary bottom power time"). When the correction is executed with using the correction signal S7a, it is understood that the laser diode 10 shows the excessive response, as shown by the broken-line areas 55, 56 and 57 in FIG. 6C. Particularly, it is understood that the laser diode 10 shows the excessive response at the time of the rise-up of the top pulse and in the space section TP3.

Next, a description will be given of the response of the laser diode 10 in the case of executing the driving by the correction signal generated based on the change amount of the laser driving signal S3, with reference to FIGS. 7A to 7C. In FIGS. 7A to 7C, the horizontal direction shows time, and the vertical direction shows the light power.

In FIGS. 7A to 7C, the top pulse section TP1, the multi pulse section TP2 and the space section TP3 are shown from left to right in this order. FIG. 7A shows the same graph as that of FIG. 6A, and shows the response light waveform of the laser diode 10 in the case of executing the driving by the laser driving signal S3 on which the correction signals S7a and S7b are not superimposed. Thereby, it is understood that the speed of the rise-up and the fall-down of the response of the laser diode 10 is slow in the multi pulse section TP2.

FIG. 7B shows the response light waveform of the laser diode 10 after the correction with using the correction signals S7a and S7b. In this case, the semiconductor laser driving device 21 sets the correction signal S7a based on the change amount of the laser driving signal S3 corresponding to the multi pulse. Namely, the correction amount which is set to the correction signal S7a corresponds to the reference correction amount. The semiconductor laser driving device 21 according to the second embodiment changes the reference correction amount thus set, based on the change amount of the laser driving signal S3.

Concretely, the semiconductor laser driving device 21 generates the correction signal S7a based on the change amount of the laser driving signal S3 corresponding to the top pulse in the top pulse section TP1. Specifically, since the change amount of the laser driving signal S3 corresponding to the top pulse is smaller than that of the laser driving signal S3 corresponding to the multi pulse, the semiconductor laser driving device 21 sets the correction amount having the changed reference correction amount so that the correction amount of the laser driving signal S3 becomes small. Thereby, it is understood that the excessive response shown by a broken line 91 does not occur from the laser diode 10 and the appropriate correction is executed. Namely, the laser diode 10 outputs the power to be outputted, and the speed of the rise-up of the output is also fast.

Meanwhile, the semiconductor laser driving device 21 directly uses the reference correction amount in the multi pulse section TP2. Namely, the semiconductor laser driving device 21 drives the laser diode 10 with using the correction signal S7a set to the reference correction amount. Thereby, it is understood that the excessive response shown by the broken line 92 does not occur from the laser diode 10 and the appropriate correction is executed.

Moreover, the semiconductor laser driving device 21 generates the correction signal S7a based on the change amount of the laser driving signal S3 in the space section TP3. Specifically, since the change amount of the laser driving signal S3 in the space section TP3 is smaller than the change amount of the laser driving signal S3 corresponding to the multi pulse, the semiconductor laser driving device 21 sets the correction amount including the changed reference correction amount so that the correction amount of the laser driving signal S3 becomes small. Thereby, it is understood that the excessive response shown by a broken-line 93 does not occur from the laser diode 10 and the appropriate correction is executed.

Meanwhile, FIG. 7C shows the response light waveform of the laser diode 10 after correction at the increased bottom power time. In this case, the semiconductor laser driving device 21 sets the correction signal S7a based on the change amount of the laser driving signal S3 corresponding to the multi pulse at the ordinary bottom power time. Namely, the reference correction amount used in this case is same as the reference correction amount used in FIG. 7B. Then, the semiconductor laser driving device 21 sets the correction signal S7a by the correction amount including the reference correction amount changed on the basis of the change amount of the laser driving signal S3.

The semiconductor laser driving device 21 generates the correction signal S7a based on the change amount of the laser driving signal S3 corresponding to the top pulse in the top pulse section TP1. Specifically, since the change amount of the laser driving signal S3 corresponding to the top pulse is smaller than that of the laser driving signal S3 corresponding to the multi pulse at the ordinary bottom power time, the semiconductor laser driving device 21 sets the correction amount including the changed reference correction amount so that the correction amount of the laser driving signal S3 becomes small. Thereby, the excessive response shown by a broken line 94 is not generated from the laser diode 10, and the appropriate correction is executed.

In addition, the semiconductor laser driving device 21 generates the correction signal S7a based on the change amount of the laser driving signal S3 corresponding to the multi pulse in the multi pulse section TP2. Specifically, since the change amount of the laser driving signal S3 at the increased bottom power time is smaller than that of the ordinary bottom power time, the semiconductor laser driving device 21 sets the correction amount including the changed reference correction amount so that the correction amount of the laser driving signal S3 becomes small. Thereby, it is understood that the excessive response shown by a broken line 95 does not occur from the laser diode 10 and the appropriate correction is executed. Similarly, the semiconductor laser driving device 21 changes the reference correction amount set based on the change amount at the time of the fall-down of the laser driving signal S3 corresponding to the multi pulse, and generates the correction signal S7b set to the correction amount after the change. By driving the laser diode 10 by the correction signal S7b, the excessive response shown by a broken line 96 does not occur from the laser diode 10, and the response characteristics of the laser diode 10 is improved.

Moreover, the semiconductor laser driving device 21 generates the correction signal S7a based on the change amount of the laser driving signal S3 in the space section TP3. Specifically, since the change amount of the laser driving signal S3 in the space section TP3 is smaller than the change amount of the laser driving signal S3 corresponding to the multi pulse at the ordinary bottom power time, the semiconductor laser driving device 21 sets the correction amount including the changed reference correction amount so that the correction amount of the laser driving signal S3 becomes small. By driving the laser diode 10 by the correction signal S7b set to the correction amount, the excessive response shown by a broken line 97 does not occur from the laser diode 10, and the response characteristics of the laser diode 10 are improved.

FIGS. 8A and 8B shows the response of the laser diode 10 in such a case that the correction is executed to the laser driving signal including the time change different from that of the above-mentioned laser driving signal. In this case, the strategy data S1 having the different shape is inputted into the write current source 1. In FIGS. 8A and 8B, the horizontal direction shows time, and the vertical direction shows the light power.

FIG. 8A shows the response light waveform of the laser diode 10 in the case of executing the driving by the laser driving signal S3 on which the correction signals S7a and S7b are not superimposed. Thereby, it is understood that the speed of the rise-up and fall-down of the response of the laser diode 1 corresponding to the laser driving signal S3 is slow.

FIG. 8B shows the response light waveform of the laser diode 10 after the correction with using the correction signals S7a and S7b. In this case, for the correction signal S7a used at the time of the rise-up of the signal, the semiconductor laser driving device 21 uses the correction amount set based on the change amount of the laser driving signal S3 shown by a broken-line area 71 as the reference correction amount. In addition, for the correction signal S7b used at the time of the fall-down of the signal, the semiconductor laser driving device 21 uses the correction amount set based on the change amount of the laser driving signal S3 shown by a broken-line area 72 as the reference correction amount. The semiconductor laser driving device 21 changes the reference correction amount set in correspondence with each of the correction signals S7a and S7b, based on the change amount of the laser driving signal S3.

Concretely, at the time of the rise-up of the laser driving signal S3, in such a case that the change amount of the laser driving signal S3 is smaller than the change amount of the laser driving signal S3 in the area 71, the semiconductor laser driving device 21 sets the correction amount including the changed reference correction amount so that the correction amount of the laser driving signal S3 becomes small. Meanwhile, in such a case that the change amount of the laser driving signal S3 is larger than the change amount of the laser driving signal S3 in the area 71, the semiconductor laser driving device 21 sets the correction amount including the changed reference correction amount so that the correction amount of the laser driving signal S3 becomes large. In addition, at the time of the fall-down of the laser driving signal S3, in such a case that the change amount of the laser driving signal S3 is smaller than that of the laser driving signal S3 in the area 72, the semiconductor laser driving device 21 sets the correction amount including the changed reference correction amount so that the correction amount of the laser driving signal S3 becomes small. Meanwhile, in such a case that the change amount of the laser driving signal S3 is larger than that of the laser driving signal S3 in the area 72, the semiconductor laser driving device 21 sets the correction amount including the changed reference correction amount so that the correction amount of the laser driving signal S3 becomes large.

By driving the laser diode 10 with using the correction signals S7a and S7b set in the above-mentioned manner, it is understood that the response showing the excessive correction and the insufficient correction shown by the broken lines 73, 74 and 75 does not occur from the laser diode 10. Namely, the response characteristics of the laser diode 10 is improved by the correction signals S7a and S7b, and the speed of the rise-up and fall-down of the response of the laser diode 10 becomes fast.

As described above, the semiconductor laser driving device 21 according to the second embodiment generates the correction signal for improving the response characteristics of the laser diode 10, based on the change of the laser driving signal S3. Thereby, the response characteristics of the laser diode 10 can be appropriately improved irrespective of the change of the laser driving signal S3.

[Modification]

The present invention is not limited to generating of the correction signal, based on the temperature of the laser diode 10 or the change amount of the laser driving signal S3. As another example, the semiconductor laser driving device can generate the correction signal, based on both of the temperature of the laser diode 10 and the change amount of the laser driving signal S3.

As still another example, the semiconductor laser driving device can generate the correction signal in accordance with the number of recording layers of the optical disc. Concretely, the semiconductor laser driving device changes the correction signal used at the time of the recording onto a one-layer optical disc, in such a case that the recording is executed onto a two-layer optical disc. For example, the semiconductor laser driving device performs the change of substantially doubling the pulse width of the correction signal, in such a case that the recording object is changed from the one-layer optical disc to the two-layer optical disc. This is because the recording onto the two-layer optical disc is normally executed by the laser power of substantially double of the laser power used for the recording onto the one-layer optical disc.

Moreover, as still another example, the semiconductor laser driving device can generate the correction signal in accordance with the recording speed onto the optical disc. In this case, the semiconductor laser driving device generates the correction signal to increase the correction amount by the correction signal in such a case that the recording speed becomes fast.

INDUSTRIAL APPLICABILITY

This invention is usable for driving control of the laser light source in a device for recording and/or reproduction of information by irradiating the laser light, such as various kinds of optical discs.

The invention claimed is:

1. A semiconductor laser driving device comprising:
a semiconductor laser which emits a laser light;
a temperature detection unit configured to detect a temperature of the semiconductor laser;
a laser driving signal generating unit configured to generate a laser driving signal for driving the semiconductor laser;
a correction signal generating unit configured to generate a correction signal used for correcting the laser driving signal based on the detected temperature;
a correction unit configured to correct the laser driving signal based on the correction signal; and
a driving unit configured to drive the semiconductor laser based on the corrected laser driving signal,
wherein the correction signal generating unit sets the correction signal to a reference correction amount when the detected temperature is a predetermined temperature,
wherein the correction signal generating unit changes the correction signal to a correction amount smaller than the reference correction amount when the detected temperature is higher than the predetermined temperature,
wherein the correction signal generating unit changes the correction signal to a correction amount larger than the reference correction amount when the detected temperature is lower than the predetermined temperature, and
wherein the correction signal generating unit executes a change of narrowing a pulse width set in a predetermined temperature in a first case that the detected temperature is higher than the predetermined temperature, and executes a change of widening the pulse width set in the predetermined temperature in a second case that the detected temperature is lower than the predetermined temperature.

2. The semiconductor laser driving device according to claim 1, wherein the correction unit corrects the laser driving signal at a timing of rise-up of the laser driving signal and at a timing of fall-down of the laser driving signal.

3. The semiconductor laser driving device according to claim 1, wherein the correction unit corrects the rise-up and the fall-down of the laser driving signal.

4. A semiconductor laser driving device comprising:
a semiconductor laser configured to emit a laser light;
a temperature detection unit configured to detect a temperature of the semiconductor laser;
a laser driving signal generating unit configured to generate a laser driving signal for driving the semiconductor laser;
a correction signal generating unit configured to generate a correction signal used for correcting the laser driving signal based on the detected temperature;
a correction unit configured to correct the laser driving signal based on the correction signal; and
a driving unit configured to drive the semiconductor laser based on the corrected laser driving signal,
wherein the correction signal generating unit sets the correction signal to a reference correction amount when the detected temperature is a predetermined temperature,
wherein the correction signal generating unit changes the correction signal to a correction amount smaller than the reference correction amount when the detected temperature is higher than the predetermined temperature,
wherein the correction signal generating unit changes the correction signal to a correction amount larger than the reference correction amount when the detected temperature is lower than the predetermined temperature,
wherein, when the detected temperature is higher than the predetermined temperature, the correction signal generating unit executes a change of accelerating a timing of superimposing the correction signal set in the predetermined temperature at a time of rise-up of the laser driving signal, and executes a change of decelerating the timing of superimposing the correction signal set in the predetermined temperature at a time of fall-down of the laser driving signal, and
wherein, when the detected temperature is lower than the predetermined temperature, the correction signal generating unit executes a change of decelerating the timing of superimposing the correction signal set in the predetermined temperature at the time of the rise-up of the laser driving signal, and executes a change of accelerating the timing of superimposing the correction signal set in the predetermined temperature at the time of the fall-down of the laser driving signal.

5. The semiconductor laser driving device according to claim 4, wherein the correction unit corrects the laser driving signal at a timing of rise-up of the laser driving signal and at a timing of fall-down of the laser driving signal.

6. The semiconductor laser driving device according to claim 4, wherein the correction unit corrects the rise-up and the fall-down of the laser driving signal.

7. A semiconductor laser driving method comprising:
a laser driving signal generating process which generates a laser driving signal for driving a semiconductor laser for emitting a laser light;
a temperature detection process which detects a temperature of the semiconductor laser;
a correction signal generating process which generates a correction signal used for correcting the laser driving signal based on the detected temperature;
a correction process which corrects the laser driving signal based on the correction signal; and
a driving process which drives the semiconductor laser based on the corrected laser driving signal,
wherein the correction signal generating process sets the correction signal to a reference correction amount when the detected temperature is a predetermined temperature,
wherein the correction signal generating process changes the correction signal to a correction amount smaller than the reference correction amount when the detected temperature is higher than the predetermined temperature,
wherein the correction signal generating process changes the correction signal to a correction amount larger than the reference correction amount when the detected temperature is lower than the predetermined temperature, and
wherein the correction signal generating process executes a change of narrowing a pulse width set in a predetermined temperature in a case that the detected temperature is higher than the predetermined temperature, and executes a change of widening the pulse width set in the predetermined temperature in a case that the detected temperature is lower than the predetermined temperature.

8. A semiconductor laser driving method comprising:
a laser driving signal generating process which generates a laser driving signal for driving a semiconductor laser for emitting a laser light;
a temperature detection process which detects a temperature of the semiconductor laser;
a correction signal generating process which generates a correction signal used for correcting the laser driving signal based on the detected temperature;
a correction process which corrects the laser driving signal based on the correction signal; and
a driving process which drives the semiconductor laser based on the corrected laser driving signal,
wherein the correction signal generating process sets the correction signal to a reference correction amount when the detected temperature is a predetermined temperature,
wherein the correction signal generating process changes the correction signal to a correction amount smaller than the reference correction amount when the detected temperature is higher than the predetermined temperature,
wherein the correction signal generating process changes the correction signal to a correction amount larger than the reference correction amount when the detected temperature is lower than the predetermined temperature,
wherein, when the detected temperature is higher than the predetermined temperature, the correction signal generating process executes a change of accelerating a timing of superimposing the correction signal set in the predetermined temperature at a time of rise-up of the laser driving signal, and executes a change of decelerating the timing of superimposing the correction signal set in the predetermined temperature at a time of fall-down of the laser driving signal, and
wherein, when the detected temperature is lower than the predetermined temperature, the correction signal generating process executes a change of decelerating the timing of superimposing the correction signal set in the predetermined temperature at the time of the rise-up of the laser driving signal,
and executes a change of accelerating the timing of superimposing the correction signal set in the predetermined temperature at the time of the fall-down of the laser driving signal.

9. A semiconductor laser driving method comprising:
a laser driving signal generating process which generates a laser driving signal for driving a semiconductor laser for emitting a laser light;
a correction signal generating process which generates a correction signal used for correcting the laser driving signal based on a change of the laser driving signal;
a correction process which corrects the laser driving signal based on the correction signal; and
a driving process which drives the semiconductor laser based on the corrected laser driving signal,
wherein the correction signal generating process sets the correction signal to a reference correction amount when a change amount of the laser driving signal is a predetermined amount,
wherein the correction signal generating process changes the correction signal to a correction amount larger than the reference correction amount when the change amount of the laser driving signal is equal to or larger than the predetermined amount, and
wherein the correction signal generating process changes the correction signal to a change amount smaller than the reference correction amount when the change amount of the laser driving signal is smaller than the predetermined amount.

10. A semiconductor laser driving device comprising:
a semiconductor laser configured to emit a laser light;
a laser driving signal generating unit configured to generate a laser driving signal for driving the semiconductor laser;
a correction signal generating unit configured to generate a correction signal used for correcting the laser driving signal, based on a change of the laser driving signal;
a correction unit configured to correct the laser driving signal based on the correction signal; and
a driving unit configured to drive the semiconductor laser based on the corrected laser driving signal,
wherein output of the laser light is changed based on the change of the laser driving signal,
wherein the correction signal generating unit sets the correction signal to a reference correction amount when a change amount of the laser driving signal is a predetermined amount,
wherein the correction signal generating unit changes the correction signal to a correction amount larger than the reference correction amount when the change amount of the laser driving signal is equal to or larger than the predetermined amount, and wherein the correction signal generating unit changes the correction signal to a change amount smaller than the reference correction amount when the change amount of the laser driving signal is smaller than the predetermined amount.

* * * * *